(12) United States Patent
Lee et al.

(10) Patent No.: US 7,963,757 B2
(45) Date of Patent: Jun. 21, 2011

(54) APPARATUS AND METHOD FOR PATTERNING PIXELS OF AN ELECTRO-LUMINESCENT DISPLAY DEVICE

(75) Inventors: Jae Yoon Lee, Seoul (KR); Sung Joon Bae, Kyunggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/783,220

(22) Filed: Apr. 6, 2007

(65) Prior Publication Data

US 2007/0181059 A1 Aug. 9, 2007

Related U.S. Application Data

(62) Division of application No. 09/837,388, filed on Apr. 19, 2001, now abandoned.

(30) Foreign Application Priority Data

Apr. 21, 2000 (KR) .................... 10-2000-0021297

(51) Int. Cl.
*B41N 1/12* (2006.01)
(52) U.S. Cl. .......... 425/92; 425/105; 425/353; 425/383; 425/385; 101/214; 101/216; 101/250; 101/325; 101/348; 427/428.06; 427/428.14; 427/428.15; 427/428.17
(58) Field of Classification Search ................. 425/105, 425/375, 92, 95, 161, 353, 355, 383, 385; 430/7; 427/164, 165, 511, 428.06, 428.14, 427/428.15, 428.16, 428.17; 435/6, 91.1, 435/287.2, 211; 101/211, 170, 483, 34, 212, 101/214, 215, 216, 217, 250, 251, 252, 269, 101/270, 272, 325, 328, 329, 348, 349.1
See application file for complete search history.

(56) References Cited

U.S. PATENT DOCUMENTS

| | | | | |
|---|---|---|---|---|
| 2,386,731 A | * | 10/1945 | Wenzelberger | 118/212 |
| 2,408,144 A | * | 9/1946 | Hucbner | 347/55 |
| 3,661,081 A | * | 5/1972 | Wright | 101/489 |
| 4,091,125 A | * | 5/1978 | Delgadillo | 427/98.5 |
| 4,152,986 A | * | 5/1979 | Dadowski et al. | 101/463.1 |
| 4,257,834 A | * | 3/1981 | Iida et al. | 156/73.6 |
| 4,313,995 A | * | 2/1982 | Delgadillo | 428/201 |
| 4,425,469 A | * | 1/1984 | Emmons et al. | 524/750 |
| 4,440,082 A | * | 4/1984 | Carey et al. | 101/170 |
| 4,507,173 A | * | 3/1985 | Klowak et al. | 162/112 |
| 4,542,693 A | * | 9/1985 | Mourrellone | 101/350.4 |
| 4,611,539 A | | 9/1986 | Ireton | |
| 5,127,330 A | * | 7/1992 | Okazaki et al. | 101/450.1 |
| 5,162,119 A | | 11/1992 | Pappas et al. | |
| 5,250,996 A | * | 10/1993 | Sugizaki et al. | 430/124.3 |

(Continued)

FOREIGN PATENT DOCUMENTS

EP 862156 A1 9/1998

(Continued)

*Primary Examiner* — Joseph S Del Sole
*Assistant Examiner* — Seyed Masoud Malekzadeh
(74) *Attorney, Agent, or Firm* — Birch, Stewart, Kolasch & Birch, LLP

(57) ABSTRACT

A patterning apparatus for an electroluminescent display includes a molding plate provided with a plurality of convex portions and concave portions; a polymer supplying roller adjacent to the molding plate to apply an electroluminescent material to the molding plate via rotational movement; and a molding roller attached to the molding plate to apply the electroluminescent material on the molding plate to an adjacent substrate via rotational movement.

8 Claims, 9 Drawing Sheets

U.S. PATENT DOCUMENTS

| | | | |
|---|---|---|---|
| 5,270,846 A | 12/1993 | Watanabe et al. | |
| 5,312,569 A * | 5/1994 | Mezei | 264/1.24 |
| 5,435,247 A * | 7/1995 | Giori et al. | 101/395 |
| 5,478,599 A * | 12/1995 | Iyer et al. | 427/355 |
| 5,480,938 A * | 1/1996 | Badesha et al. | 525/104 |
| 5,500,299 A * | 3/1996 | Badesha | 428/447 |
| 5,514,503 A * | 5/1996 | Evans et al. | 430/7 |
| 5,540,147 A * | 7/1996 | Johnson | 101/211 |
| 5,597,618 A | 1/1997 | Bayer et al. | |
| 5,624,775 A * | 4/1997 | Carre et al. | 430/7 |
| 5,674,553 A | 10/1997 | Shinoda et al. | |
| 5,682,043 A | 10/1997 | Pei et al. | |
| 5,701,055 A | 12/1997 | Nagayama et al. | |
| 5,701,815 A * | 12/1997 | Bocko et al. | 101/211 |
| 5,827,577 A | 10/1998 | Spencer | |
| 5,884,560 A * | 3/1999 | Opitz et al. | 101/401 |
| 5,972,545 A * | 10/1999 | Eid et al. | 430/7 |
| 6,013,446 A * | 1/2000 | Maracas et al. | 435/6 |
| 6,114,404 A * | 9/2000 | Deeken et al. | 522/88 |
| 6,213,018 B1 | 4/2001 | Samworth | |
| 6,373,187 B1 * | 4/2002 | Nagayama et al. | 313/506 |
| 6,850,311 B2 * | 2/2005 | Hasegawa et al. | 349/187 |
| 7,187,117 B2 * | 3/2007 | Lu | 313/504 |
| 7,187,120 B2 * | 3/2007 | Ohshita et al. | 313/504 |
| 7,245,080 B2 * | 7/2007 | Lee et al. | 313/610 |

FOREIGN PATENT DOCUMENTS

| | | | |
|---|---|---|---|
| JP | 2-146127 | * | 6/1990 |
| JP | 3-194740 | * | 8/1991 |
| JP | 1082907 A | | 3/1998 |

* cited by examiner

APPARATUS AND METHOD FOR PATTERNING PIXELS OF AN ELECTRO-LUMINESCENT DISPLAY DEVICE

This application is a Divisional of application Ser. No. 09/837,388 filed on Apr. 19, 2001, now abandoned and for which priority is claimed under 35 U.S.C. §120; and this application claims priority of Application No. P00-21297 filed in Korea on Apr. 21, 2000 under 35 U.S.C. §119; the entire contents of all are hereby incorporated by reference.

BACKGROUND OF THE INVENTION

1. Field of the Invention

This invention relates to a technique of fabricating flat panel display devices, and more particularly to an apparatus and method for patterning an electro-luminescent display device for forming pixels into minute patterns in such an electro-luminescent display device.

2. Description of the Related Art

Recently, various flat panel display devices have been developed which are reduced in weight and bulk, thereby eliminating several disadvantages of a cathode ray tube (CRT). Such flat panel display devices include a liquid crystal display (LCD), a field emission display (FED), a plasma display panel (PDP), and an electro-luminescent (EL) display device. Heightening the display quality of flat panel display devices and providing flat panel displays with a large-scale screen have been actively investigated. The PDP has been highlighted as a display device having the advantages of a light weight, a thin thickness and a small bulk as well as a large-scale screen owing to its simple structure and manufacturing process. However, the PDP has the drawbacks of a low emission efficiency, a low brightness and a high power consumption.

An active matrix LCD employing thin film transistors (TFT's) as switching devices is difficult to manufacture as a large-scale screen. An active matrix LCD exploits the efficiencies of semiconductor processing techniques, and has been largely used as a display device for notebook computers. Consequently, demand for large-scale screens has been insufficient to justify large-scale semiconductor processing. However, the LCD has large drawbacks in that it is difficult to provide a large screen area and power consumption is high due to a backlight unit. Also, the LCD has the undesirable characteristics of a large light loss and a narrow viewing angle due to a polarizing filter, a prism sheet and a diffuser, etc.

EL display devices may be classified into inorganic EL devices and organic EL devices, depending on the type of material used in a light-emitting layer. Such a device is "self-emitting," emitting its own light. The EL display device has the great advantages of a rapid response speed, high emission efficiency, good brightness, and a large viewing angle.

In the organic EL display device as shown in FIG. 1, an anode electrode 31 composed of a transparent electrode pattern is provided on a glass substrate 2, and a hole injecting layer 32, a light-emitting layer 33 and an electron injecting layer 34 are sequentially disposed thereon. A cathode electrode 35 composed of a metal electrode is provided on the electron-injecting layer 34. When a driving voltage is applied to the anode electrode 31 and the cathode electrode 35, holes within the hole injecting layer 32 and electrons within the electron injecting layer 34 migrate toward the light-emitting layer 33 to excite a fluorescent material within the light-emitting layer 33. A picture or an image is displayed by the visible light generated from the light-emitting layer 33 in this manner. It is difficult to manufacture such an EL display device with a large-scale screen, because current mass-production techniques and processes are inadequate to repetitively manufacture a screen of more than 10 inches.

Studies of patterning pixels of the EL device have been made, but it is not yet conventionally possible to make a minute pattern and to make a repetitive manufacturing of red, green and blue pixels for a large-scale device. For example, an organic EL material cannot be patterned by wet etching because it is liable to be melted by a solvent or moisture. For this reason, the organic EL material cannot be patterned by photolithographic techniques which are advantageous for formation of minute patterns. A low-molecule organic EL material may be patterned using a method of independently forming each of red, green and blue materials using a minute-patterned shadow mask, but such a technique is limited by the accuracy with which shadow masks may be constructed. Such masks do not have a resolution beyond a certain level, and are difficult to accurately use over a large field due to a tension deviation, etc. of the shadow mask. A method of patterning pixels using an ink-jet injection head for a high-molecule or polymer organic EL material has been studied. However, it is difficult to form a pinhole-free thin film of less than 1000 Å thickness using such a method. A scheme of providing color filters on a white EL material, or of providing a color changing medium on a blue EL material, has been considered, but such a scheme causes a large light loss due to the color filters or the color changing medium.

SUMMARY OF THE INVENTION

Accordingly, the present invention is directed to an apparatus and method of manufacturing an electro-luminescent display device that substantially obviate one or more of the problems due to limitations and disadvantages of the related art.

In accordance with the purpose of the invention, as embodied and broadly described, in one aspect the invention includes a patterning apparatus for an electro-luminescent display, including: a molding plate provided with a plurality of convex portions and concave portions; a polymer supplying roller adjacent to the molding plate to apply an electro-luminescent material to the molding plate via rotational movement; and a molding roller attached to the molding plate to apply the electro-luminescent material on the molding plate to an adjacent substrate via rotational movement.

In another aspect, the invention includes a method of patterning an electro-luminescent display, including: providing a molding plate with convex and concave portions on a molding roller; applying an electro-luminescent material to the convex portions of the molding plate; and printing the electro-luminescent material from the molding plate onto a substrate by rotating the molding roller so that the material on the convex portions contacts the substrate.

The method and apparatus advantageously produce an electro-luminescent display having pixels formed in minute patterns.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

These and other objects of the invention will be apparent from the following detailed description of the present invention with reference to the accompanying drawings.

DETAILED DESCRIPTION OF THE PREFERRED EMBODIMENTS

Figure 2:
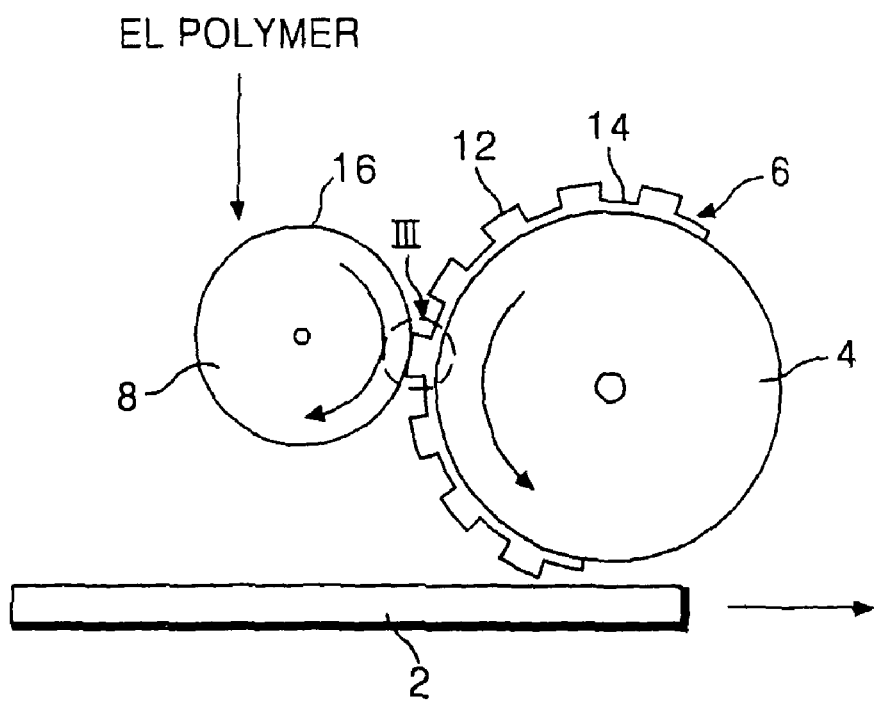
FIG. 2 is a section view showing the structure of a patterning apparatus for an electro-luminescent display device according to a first embodiment of the present invention.

FIG. 2 shows a patterning apparatus for an electro-luminescent display device according to a first embodiment of the present invention. The patterning apparatus in FIG. 2 includes a molding plate 6 provided with lands 12 and grooves 14. The molding plate 6 is attached to a molding roller 4. The apparatus also includes a polymer supply roller 8 for applying an EL polymer solution 16 onto the lands 12 of the molding plate 6. Under the molding roller 4, a glass substrate 2 is supplied to receive EL polymer solution 16 from the molding plate 6. Various types of EL polymers and other EL materials suitable for use with such an apparatus will be appreciated and employed by those skilled in the display art.

Figure 4:
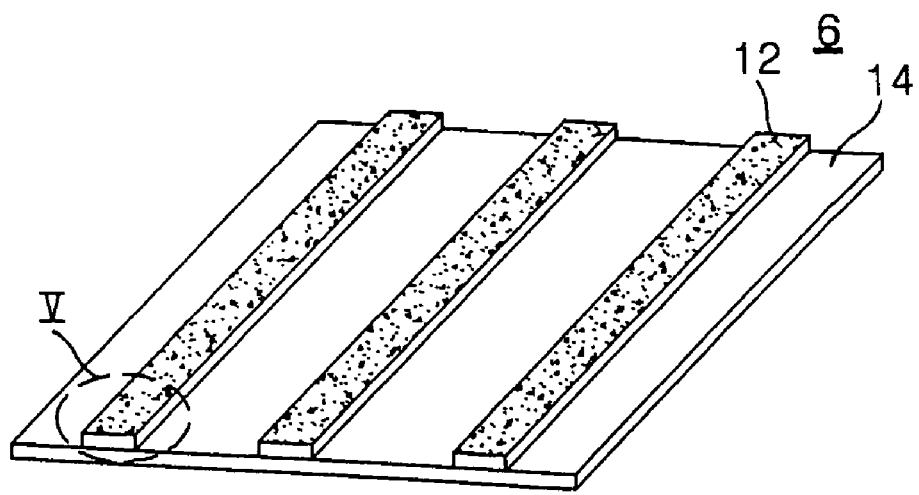
FIG. 4 is a detailed perspective view of the molding plate 6 shown in FIG. 2.
Figure 5:
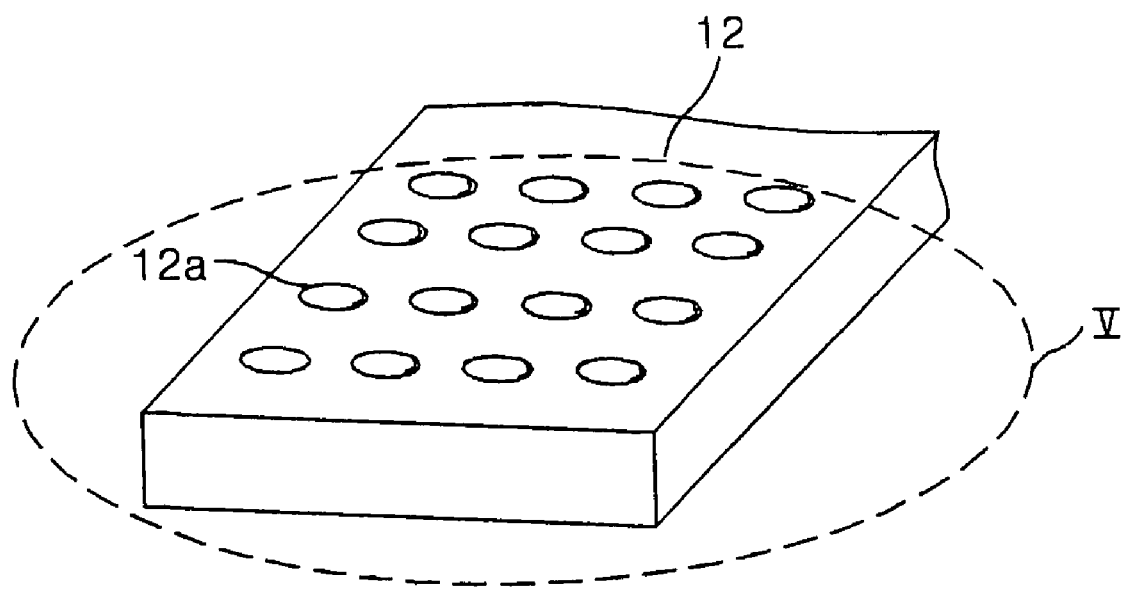
FIG. 5 is a partial enlarged view of the "V" portion indicated by a dotted circle in FIG. 4.

The lands 12 may protrude in a stripe shape (i.e., roughly linearly) between the grooves 14 as shown in FIG. 4. As shown in greater detail in FIG. 5, each land 12 includes a number of indentations 12a extending along its entire length. These indentations 12a help the lands 12 pick up and retain a greater amount of polymer material 16 from contact with the supply roller 8.

Figure 3:
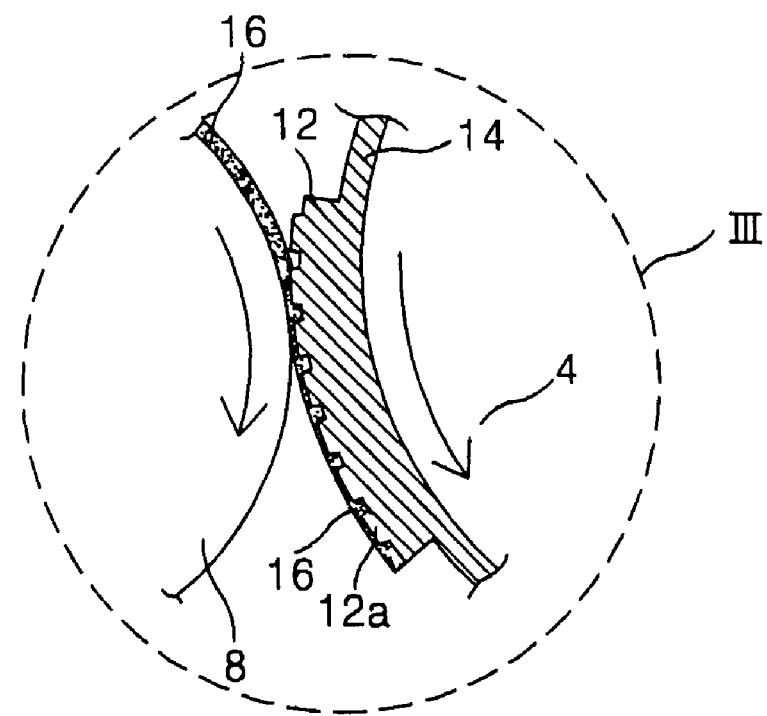
FIG. 3 is a partial enlarged view of the "III" portion indicated by a dotted circle in FIG. 2.

As shown in greater detail in FIG. 3, the lands 12 contact the polymer supply roller 8, which is coated with the EL polymer solution 16, and are uniformly coated with the EL polymer solution 16 to a desired thickness (e.g., less than 1000 Å). The grooves 14 of the molding plate 6 are not coated with the EL polymer solution 16, because they do not contact the polymer supply roller 8. By its rotating motion, the molding roller 4 causes the EL polymer solution 16 coated on the surface of the polymer supply roller 8 to be transferred to the lands 12 of the molding plate 6. Also, the molding roller 4 causes the lands 12 of the molding plate 6 coated with the EL polymer solution 16 to come in contact with the glass substrate 2 by its rotating motion.

A blade or other roller (not shown) may be installed adjacent to the surface of the polymer supply roller 8 so that the polymer solution 16 is evenly coated with a uniform thickness on the roller 8. This causes the solution 16 transferred to the molding roller 4, as shown in FIG. 3, also to be of uniform thickness.

Figure 6A:
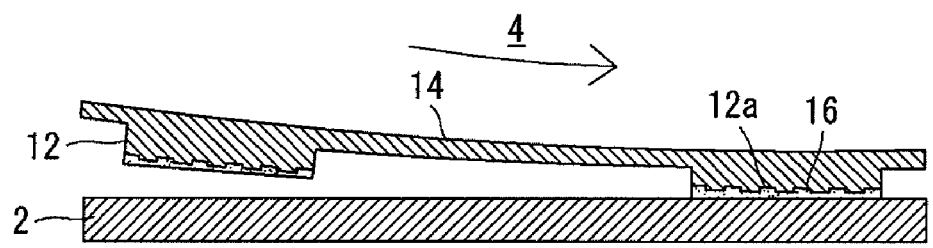
FIG. 6A to FIG. 6C are sectional views representing a process of forming pixel patterns of the electro-luminescent display device using the patterning device in FIG. 2.

A process of patterning a light-emitting layer of the EL display device using the patterning apparatus as mentioned above will be described with respect to FIGS. 6A-6C. First, an EL polymer solution 16 having any one of red, green and blue colors is applied to the polymer supply roller 8. Then, as shown in FIG. 3, the EL polymer solution 16 is coated on the polymer supply roller 8 by rotational movement of the polymer supply roller 8. At this time, the molding roller 4 is interlinked with the rotating polymer supply roller 8 to be rotated in an opposite direction to the polymer supply roller 8. The EL polymer solution 16 coated on the lands 12 of the molding plate 6 contacts the glass substrate 2 supplied under the molding roller 4 by a rotating motion of the molding roller 4, as shown in FIG. 6A. At this time, the EL polymer solution 16 is inversely propagated onto the glass substrate 2.

Figure 6B:
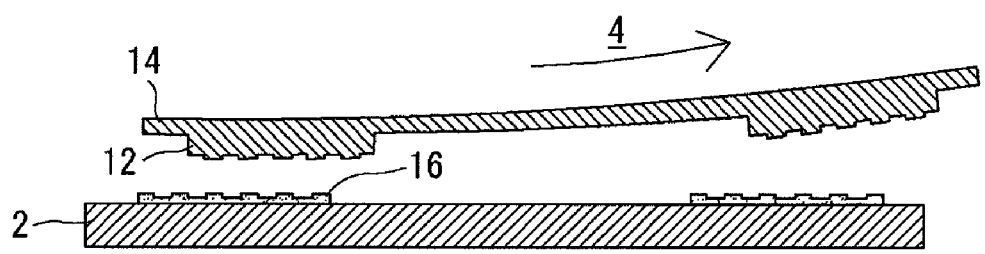
Figure 6C:
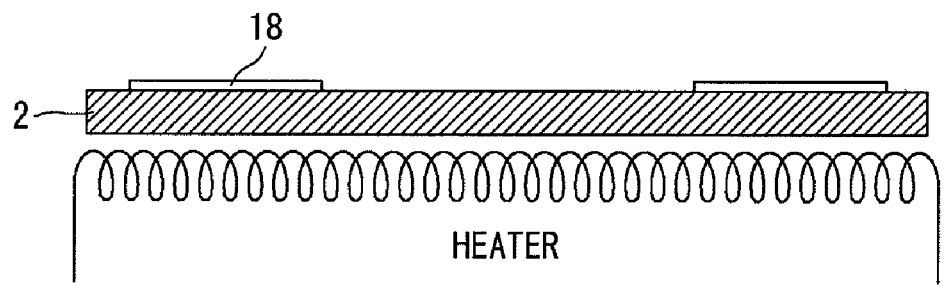

The lands 12 printed with the polymer solution 16 on the glass substrate 2 are separated from the glass substrate 2 as shown in FIG. 2 as shown in FIG. 6B by a rotation of the molding roller 4. The EL polymer solution 16 printed on the glass substrate 2 deforms to have an even surface as shown in FIG. 6C just after the printing. Such evening of the surface of solution 16 is due to a material property of the polymer solution. Subsequently, the EL polymer solution 16 on the glass substrate 2 is heated at a desired temperature by a heater. As a result, the pixel pattern 18 shown in FIG. 6C is provided on the glass substrate 2. After the pixel pattern 18 with a specific color is formed as described above, another pixel pattern with a different color is provided in a similar manner.

Figure 1:
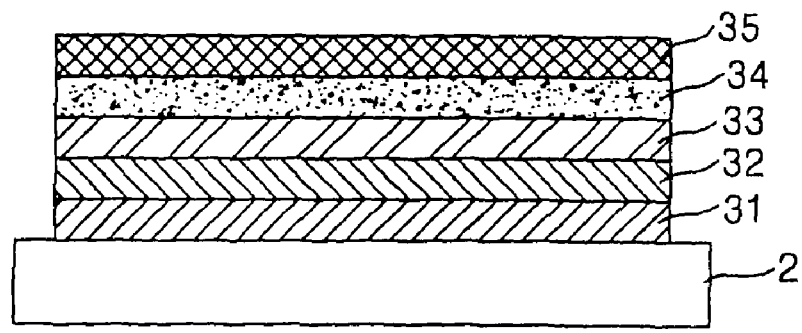
FIG. 1 is a schematic section view showing the structure of a conventional organic electro-luminescent display device.

The patterning method of printing the pixel patterns on the glass substrate 2 using the roller as described above is applicable to the formation of the red, green and blue patterns of the light-emitting layer, as shown in the above embodiment, but may also be used to form other organic material layers included in the EL display. Examples of such other layers are the hole injecting layer 32 or the electron injecting layer 34 shown in FIG. 1. Such a patterning method reduces waste of material compared to, for example, a conventional spin-coating method.

Figure 7A:
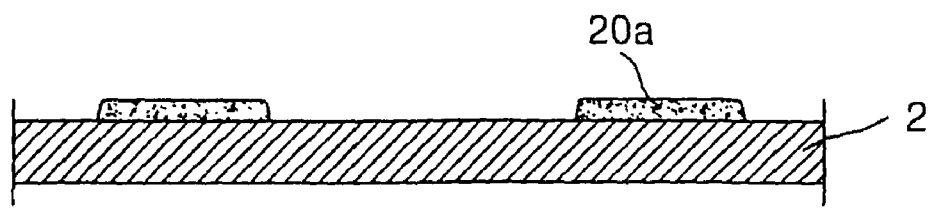
FIG. 7A to FIG. 7C are sectional views showing spreading of the pixel pattern of FIG. 6C.
Figure 7B:
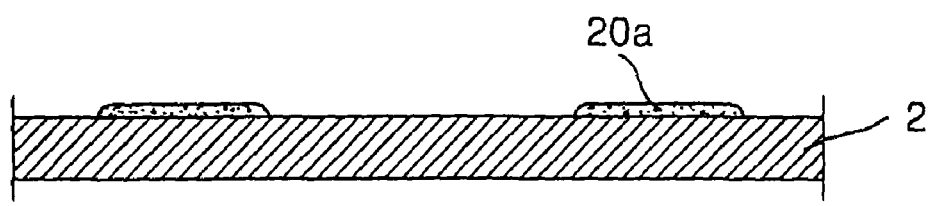
Figure 7C:
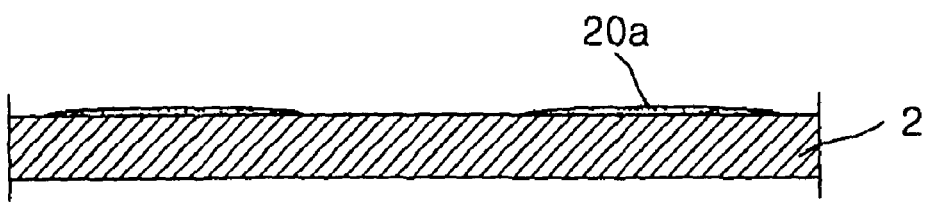

However, the method of forming the EL organic material layer on the substrate using the roller tends to accelerate a membrane spread of the pixel pattern or the organic material layer 20a, as shown in FIGS. 7A to 7C. Just after printing, a wetting characteristic and a leveling characteristic of the EL polymer solution cause the layer 20a to increase in width and decrease in uniformity. As a result, the pixel pattern or the organic material layer 20a formed on the substrate has not only a non-uniform thickness, but also worsened color purity and device characteristics.

Figure 8:
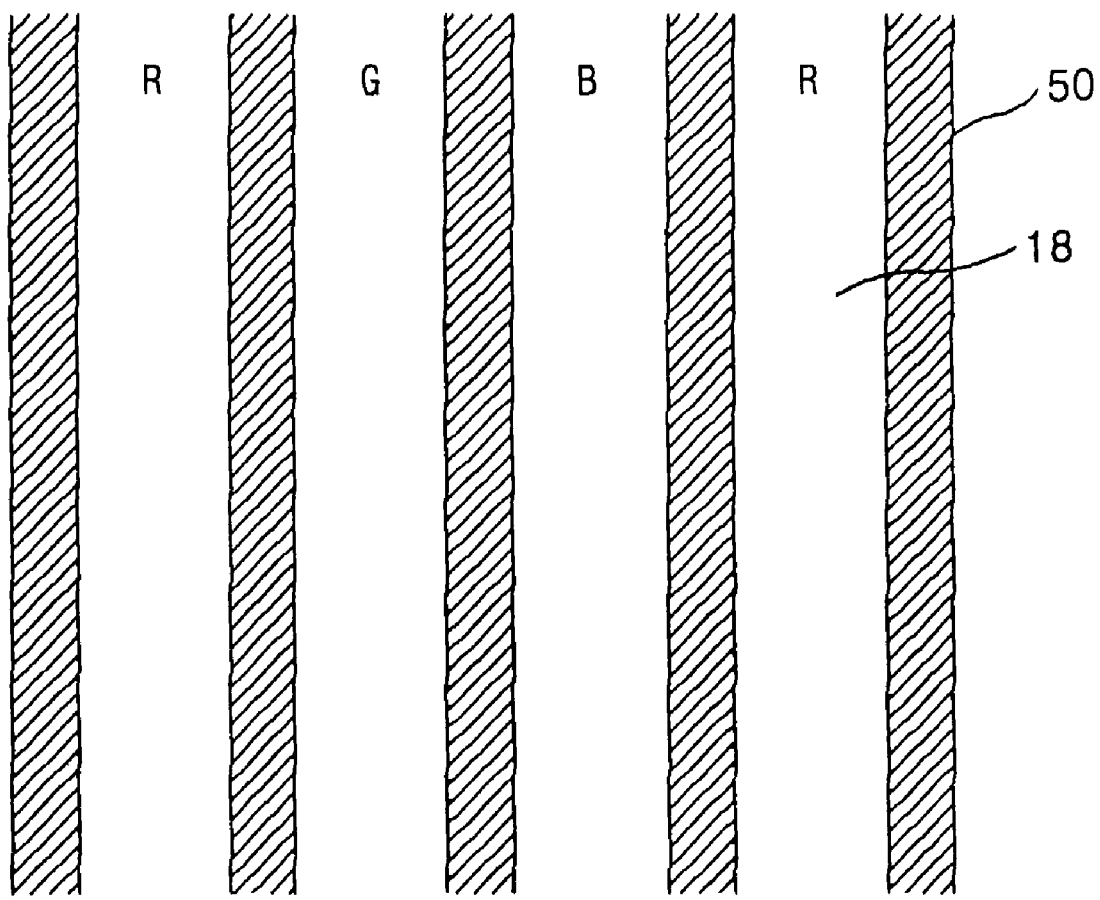
FIG. 8 is a plan view showing barrier ribs provided between pixel patterns in a patterning method of pixel patterns according to a second embodiment of the present invention.

In order to reduce such membrane spread of the pixel pattern or the organic material layer 20a, the patterning method according to a second embodiment of the present invention provides barrier ribs 50 for reducing such membrane spread of the organic material between the adjacent pixel pattern areas as shown in FIG. 8. Red (R), green (G), and blue (B) pixel patterns 18 are formed between the barrier ribs 50.

Figure 9A:
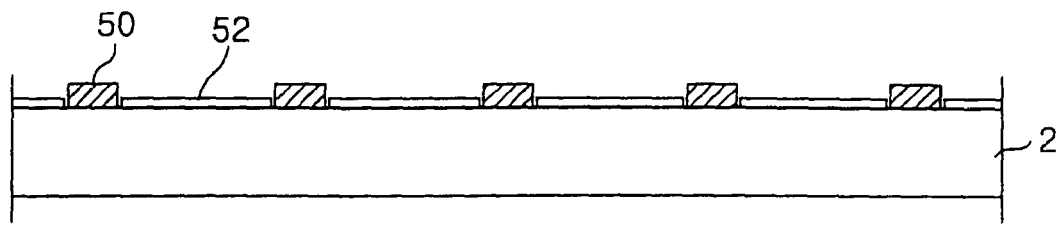
FIG. 9A to FIG. 9D are sectional views representing a process of forming pixel patterns of an electro-luminescent display device on a substrate provided with the barrier ribs shown in FIG. 8.
Figure 9B:
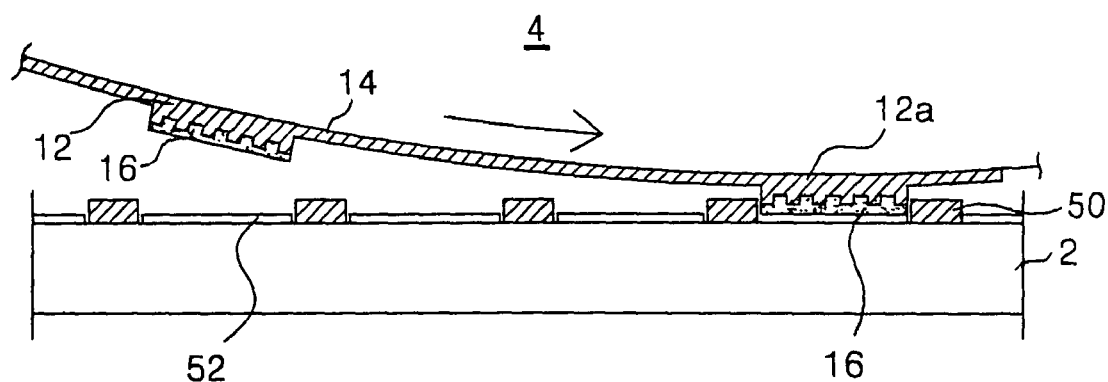
Figure 9C:
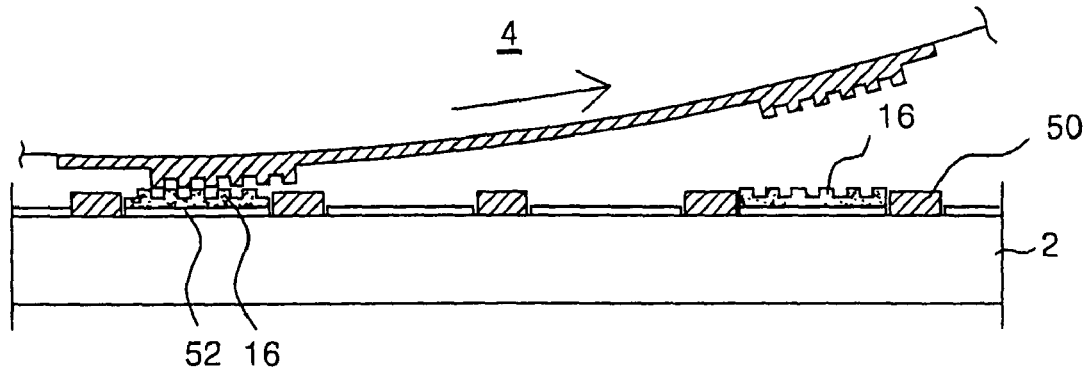
Figure 9D:
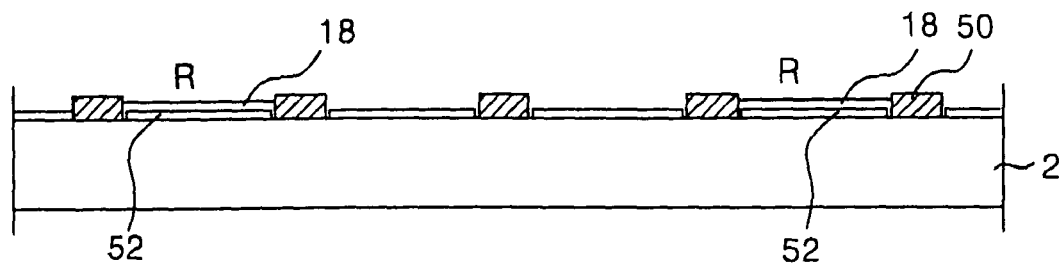

Referring now to FIG. 9A, the barrier ribs 50 are provided with a desired spacing on the glass substrate 2 in the patterning method according to the second embodiment. Between the barrier ribs 50, an indium-tin-oxide (ITO) pattern 52 used as a pixel electrode is provided. The barrier rib 50 is formed with a larger thickness or height than a pixel pattern or an organic material layer 18 to be formed on the glass substrate 2. A material of the barrier rib 50 can be selected from any one of inorganic materials such as $SiN_X$ and $SiO_2$, etc. and organic materials such as a polyimide and an acryl group, etc. Depending on the material used, the barrier ribs 50 may be formed by conventional photolithographic processes. Subsequently, as shown in FIGS. 9B-9D, the EL polymer solution 16 is printed on the ITO pattern 52 using the molding roller 4 and the molding plate 6 as described above. At this time, any membrane spread of the EL polymer solution 16 is limited by the barrier ribs 50, so that the EL polymer solution 16 is formed with a uniform thickness on the glass substrate 2. After the red (R) pixel pattern 18 is formed as shown in FIG. 9D, green and blue pixel patterns are sequentially formed in a similar manner.

FIG. 10 and FIGS. 11A to 11D show a patterning method according to a third embodiment of the present invention, which is applied to an EL device provided with TFT's as switching devices.

Figure 10:
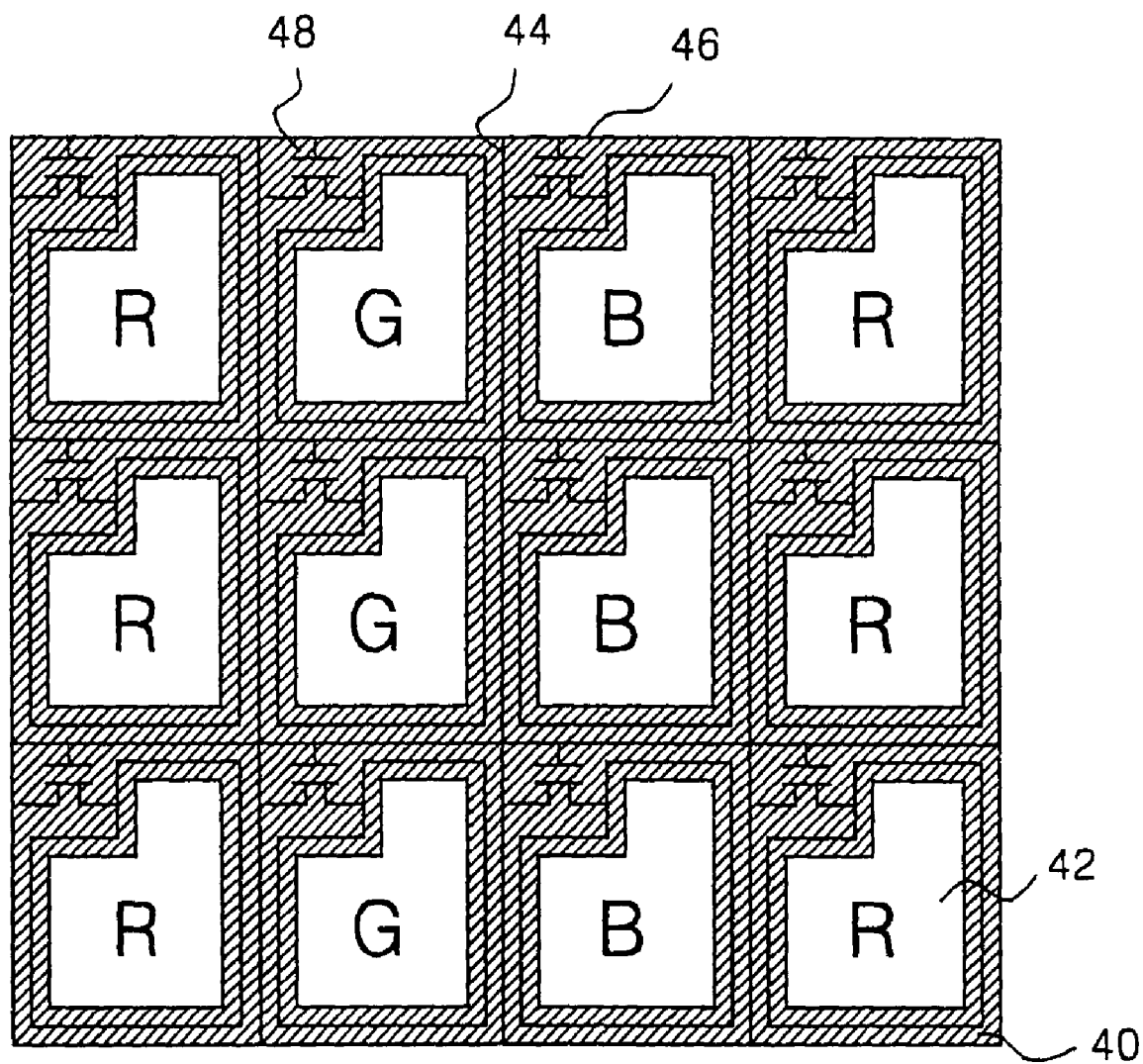
FIG. 10 is a plan view showing barrier ribs provided between pixel patterns in a patterning method of pixel patterns according to a third embodiment of the present invention.

Referring to FIG. 10, barrier ribs 40 are provided on the glass substrate 2 to cover the edges of ITO patterns 42. The barrier rib 40 covers the edge of the ITO pattern 42, a source line 44, a gate line 48 and a TFT 48. Also, the barrier rib 40 is formed into a larger thickness than the pixel pattern or the organic material layer 18 printed on the ITO pattern 42. A material of the barrier rib 40 can be selected from any one of inorganic materials such as $SiN_X$ and $SiO_2$, etc. and organic materials such as a polyimide and an acryl group, etc.

Figure 11A:
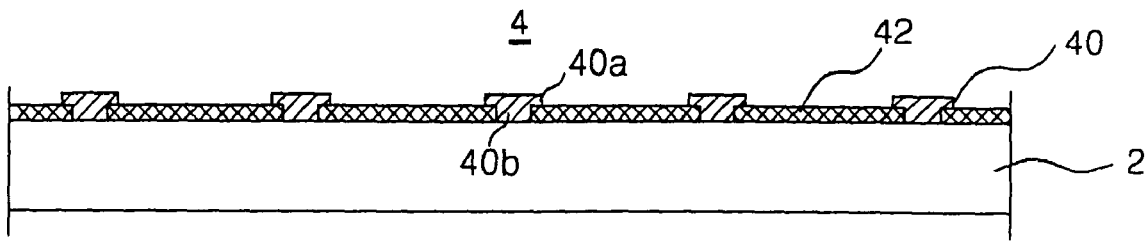
FIG. 11A to FIG. 11D are sectional views representing a process of forming pixel patterns of an electro luminescent display device on a substrate provided with the barrier ribs shown in FIG. 10.
Figure 11B:
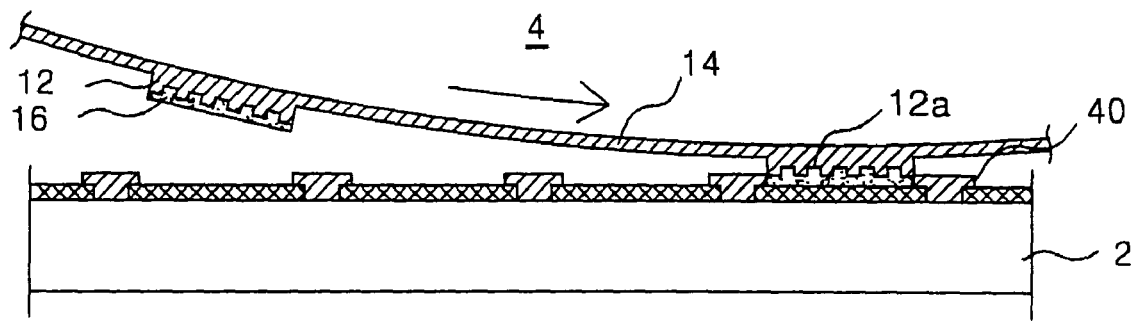
Figure 11C:
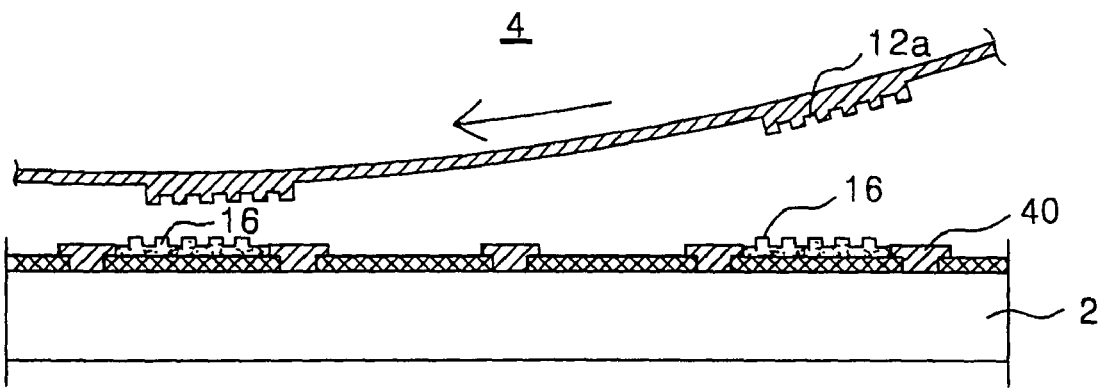
Figure 11D:
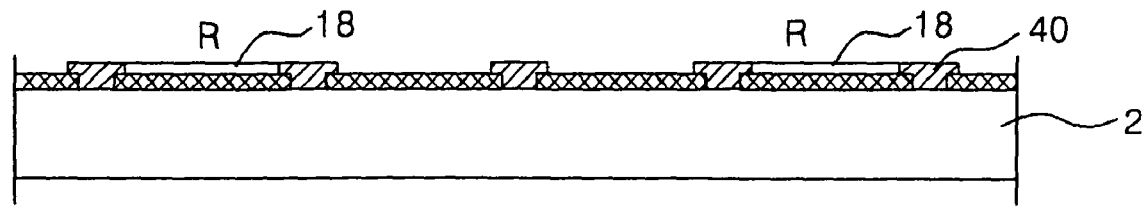

Referring now to FIG. 11A, the barrier rib 40 has a neck 40b with a small width and a head 40a with a large width. The edge of the ITO pattern 42 is formed adjacent to the neck 40b. Thus, the edge of the ITO pattern 42 is overlapped by the head 40a of the barrier rib 40. Subsequently, the EL polymer solution 16 is printed on the ITO pattern 42 as shown in FIGS. 11B and 11C using the molding roller 4 and the molding plate 6 as mentioned above. Of course, the molding roller 4 according to this third embodiment of the invention has lands and grooves shaped to correspond to the pixel and barrier structure shown in FIG. 10. At this time, a membrane spread of the EL polymer solution 16 is limited by the head 40a of the barrier rib 40, so that the EL polymer solution 16 is formed into a uniform thickness on the glass substrate 2. Heating fixes the polymer solution 16 into a pixel pattern 18. After the red (R) pixel pattern 18 is formed in this manner, the green and blue pixel patterns are sequentially formed in a similar manner.

As described above, according to the present invention, after a molding plate molded into a pixel pattern shape is coated with the EL polymer solution, the solution is inversely propagated onto the glass substrate. Pixels with minute patterns are formed in this manner. Furthermore, barrier ribs may be provided between the pixel patterns to prevent the membrane spread at the time of printing the EL polymer solution, and to minimize any color deterioration of the devices. By using such barrier ribs, reliability of such a device may be raised and its life may be prolonged.

Although the present invention has been explained by the embodiments shown in the drawings described above, it should be understood by the person ordinarily skilled in the art that the invention is not limited to the embodiments, but rather that various changes or modifications thereof are possible without departing from the spirit of the invention. For example, it is envisioned that the molding plate 6 and the roller 4 could be formed as a single, unitary piece. Accordingly, the scope of the invention shall be determined only by the appended claims and their equivalents.

What is claimed is:

1. A patterning apparatus for an electroluminescent display which comprises:
    a molding roller;
    a molding plate provided at the surface of the molding roller and containing a plurality of convex portions and concave portions the convex portions defining lands having a surface which contains a plurality of minute indentations;
    a polymer supplying roller positioned to engage with the lands of the convex portions of the molding plate for applying an electroluminescent material only to the lands of the molding plate via rotational movements of both the polymer supplying roller and the molding roller,
    wherein the molding plate applies the electroluminescence material disposed on the lands of the molding plate to an adjacent substrate via the rotational movement of the molding roller and a linear movement of the adjacent substrate, and
    the adjacent substrate includes a pixel electrode forming a pixel pattern and a plurality of barrier ribs positioned to receive the electroluminescence material therebetween for preventing the electroluminescent material from spreading, at least one barrier rib including a neck and a head having a larger width than the neck whereby a portion of the head overlaps an edge of the pixel electrode; and
    a heating device positioned to heat, to a predetermined temperature, the electroluminescent material formed on the substrate.

2. The patterning apparatus according to claim 1, wherein the lands have a strip shape and extend linearly across the surface of the molding plate.

3. The patterning apparatus according to claim 1, wherein the lands have a small rectangular form.

4. The patterning apparatus according to claim 1, wherein the lands have a shape corresponding to the pixel pattern.

5. The patterning apparatus according to claim 4, wherein the barrier rib is positioned between pixel patterns adjacent to each other and formed in a stripe shape.

6. The patterning apparatus according to claim 1, wherein the barrier ribs are positioned between pixel patterns adjacent to each other and formed in a lattice shape.

7. The patterning apparatus according to claim 1, wherein the electroluminescent material formed on the substrate has an even, uniform surface.

8. The patterning apparatus according to claim 1, further comprising a blade operatively associated with the polymer supplying roller so that the electroluminescent material is evenly coated on the polymer supplying roller.

* * * * *